US006975504B2

(12) United States Patent
Robinson et al.

(10) Patent No.: US 6,975,504 B2
(45) Date of Patent: Dec. 13, 2005

(54) OVERALL WATTHOUR METTER ENCLOSURE SAFETY REPLACEMENT WINDOW

(75) Inventors: Darrell Robinson, Highland, MI (US); Allen V. Pruehs, Howell, MI (US)

(73) Assignee: Ekstrom Industries, Inc., Farmington Hills, MI (US)

( * ) Notice: Subject to any disclaimer, the term of this patent is extended or adjusted under 35 U.S.C. 154(b) by 610 days.

(21) Appl. No.: 10/113,768

(22) Filed: Apr. 1, 2002

(65) Prior Publication Data

US 2003/0184956 A1   Oct. 2, 2003

(51) Int. Cl.[7] .................................................. H02B 1/00
(52) U.S. Cl. .................. 361/659; 361/667; 174/17 CT; 174/66
(58) Field of Search .................. 361/600, 664–668; 174/52; 220/284; 324/110

(56) References Cited

U.S. PATENT DOCUMENTS

| | | | | |
|---|---|---|---|---|
| 3,142,001 A | * | 7/1964 | Spencer et al. | 361/667 |
| 3,591,835 A | * | 7/1971 | Sloop | 361/672 |
| 3,617,814 A | * | 11/1971 | Stanback | 361/660 |
| 4,153,176 A | * | 5/1979 | Carson | 220/484 |
| 4,747,016 A | * | 5/1988 | Sloop, Sr. | 361/672 |
| 5,959,243 A | * | 9/1999 | Thiel | 174/17 CT |
| 6,280,805 B1 | * | 8/2001 | Markovich | 428/34.1 |

* cited by examiner

Primary Examiner—Boris Chervinsky
(74) Attorney, Agent, or Firm—Young & Basile, P.C.

(57) ABSTRACT

A safety replacement window for an overall watthour meter enclosure includes a window covering a window aperture of a cover of the enclosure. Mounting clips integrally carried on the cover snap into and fix the window in the cover aperture. In another aspect, the cover is formed of a one-piece molded member having at least a transparent portion overlaying a watthour meter mounted on a plate to which the cover is mounted.

40 Claims, 11 Drawing Sheets

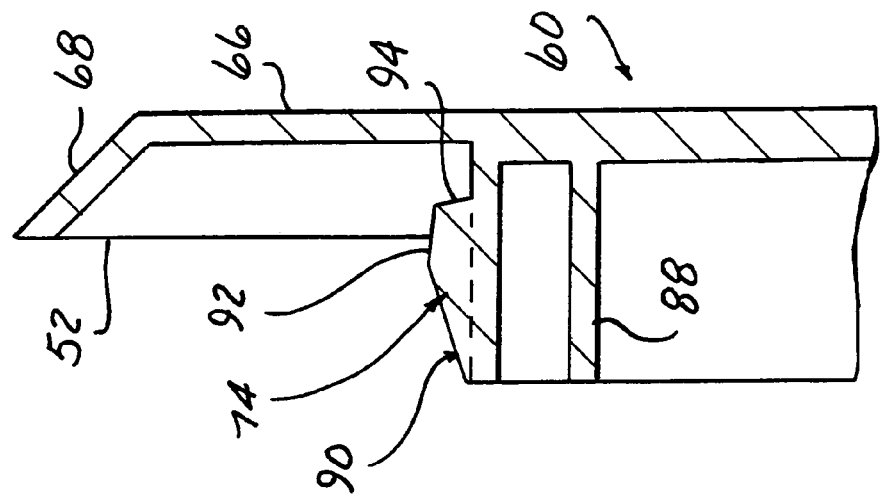
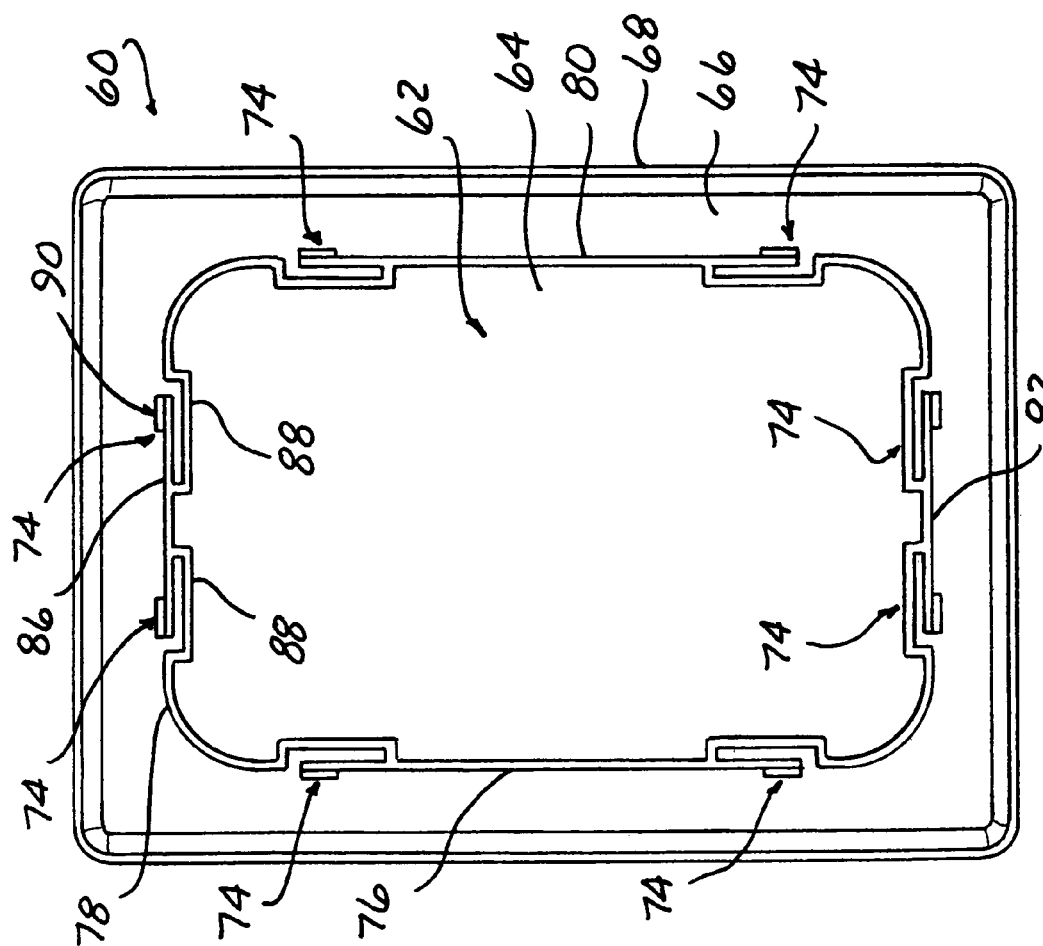

OVERALL WATTHOUR METTER ENCLOSURE SAFETY REPLACEMENT WINDOW

BACKGROUND

The present invention relates, in general, to electrical power service apparatus and, more particularly, to full enclosure covers for watthour meters.

Electrical power is supplied to an individual site or service by external electrical power line conductors located above or below ground. In a conventional arrangement, electrical power line conductors are connected to terminals in a watthour meter socket mounted on a wall. Electrical load conductors are connected to another set of terminals in the meter socket and extend to the electrical distribution network in the building. The watthour meter has conductors connectible to both pairs of terminals in the meter socket to measure the electrical power drawn through the load conductors.

Older style bottom connected meters have the aforementioned terminals located below the meter which is fixedly mounted on a back plate of an enclosure. The line and load conductors are also attached to the terminals.

A cover is pivotally attached to the back plate to sealingly encompass the watthour meter mounted on the back plate. Lock connections may be provided between the cover and the back plate to receive a padlock or a wire seal which is useful in providing an indication of tampering with the meter enclosure.

A transparent glass window is mounted in the cover in a position to expose the watthour meter power readout dials to viewing from outside of the enclosure. The glass is held in place by spring clips removably mounted in plates attached by welding, to the inside surface of the cover. A seal material may also be employed between the glass and the surrounding inside cover surface to seal the window aperture from the exterior environment.

However, the glass is susceptible to breakage, either due to vandalism or from normal exposure to the environment. The spring clips are also susceptible to breakage, rusting, etc. thereby allowing the glass to separate from the cover surface.

These conditions allow the ingress of rain and debris into the interior of the enclosure, any of which can lead to serious and dangerous situations if such rain or debris comes in contact with the power carrying conductors and terminals within the enclosure.

The spring clips are also susceptible to separation from the mounting plates. Since the spring clips are formed of metal, the spring clips can result in a short circuit if the spring clip falls across conducting portions of the terminals or conductors, again leading to a dangerous and possibly explosive event.

Thus, it would be desirable to provide a replacement window for an overall watthour meter enclosure which addresses the deficiencies encountered with previously devised glass windows in such enclosures. It would also be desirable to provide a replacement window for an overall watthour meter enclosure which can be easily installed in overall existing enclosure covers. It would also be desirable to provide a replacement window for an overall watthour meter enclosure in which the entire front cover can be replaced by a single piece member which addresses all of the deficiencies encountered with previously devised metal covers with glass windows as well as providing long term reliable use, complete sealing of the watthour meter and terminals within the enclosure, and easy viewability of the meter power indicator dials. It would also be desirable to provide a replacement window/cover for an overall watthour meter enclosure which has a higher degree of vandalism resistance and, at the same time, provides an easy indication of any attempt to unauthorizedly tamper with the enclosure.

SUMMARY OF THE INVENTION

The present invention is a safety replacement window for an overall watthour meter enclosure which has an aperture in a front wall of a cover overlaying and providing viewability of watthour meter power indicator dials mounted in the enclosure.

In one aspect, the replacement window is adapted to be mounted in the aperture in a watthour meter enclosure cover. The window includes mounting means, integrally carried on the window for mounting the window in a cover aperture.

A barrier depends from one surface of the window and is extendable through the aperture in the cover when the window is mounted on the cover. The barrier defines a wall. At least one and, preferably, a plurality of mounting clips are spacedly carried on the barrier.

A central portion of the window has a greater thickness within the peripheral extent of the barrier than the thickness of a peripheral edge of the window.

In another aspect, the present invention is an improvement in an overall watthour meter enclosure. The enclosure includes a plate adapted to carry a watthour meter; a cover mountable on the plate, an aperture formed in the cover, a window mountable on the cover in the aperture, and mounting means, carried on the window, for fixedly mounting the window in the aperture in the cover.

In yet another aspect, the present invention is an improvement in an overall watthour meter enclosure. The enclosure includes a plate adapted to carry a watthour meter, and a one piece cover removably mounted on the plate, the cover having at least a transparent portion for viewing the watthour meter therethrough.

In one aspect, the cover has a front wall, a pocket formed in the front wall for surrounding an end portion of a watthour meter mounted on the plate and a bottom wall. A lock arm is carried on the bottom wall and is adapted to register with a lock member carried on the plate. Apertures in the lock arm and the lock flange readapted to receive lock member for securing the cover to the back plate.

In another aspect, the cover includes a planar front wall and opposed sidewalls extending from the front wall.

The safety replacement window and/or cover of the present invention provides significant advantages for an overall watthour meter enclosure. The replacement window is formed of one-piece molded plastic which is snap mounted in the window aperture to seal the interior of the watthour meter enclosure. The one-piece cover provides long term reliable use without breakage. At the same time, the replacement window and/or cover provides visible evidence of tampering with the cover, such as any attempt to remove the window from the cover. The replacement window can also be embodied in a full replacement cover having at least a transparent portion and, preferably, formed entirely of a transparent plastic. The replacement cover can be mounted on and secured to an overall watthour meter enclosure back plate in the same manner as the prior art metal covers.

BRIEF DESCRIPTION OF THE DRAWING

The various features, advantages and other uses of the present invention will become more apparent by referring to the following detailed description and drawing in which:

FIG. 3 is a rear plan view of the replacement window shown in FIG. 2;

FIG. 4 is a cross-sectional view generally taken along line 4—4 of FIG. 2;

DETAILED DESCRIPTION

Figure 12:
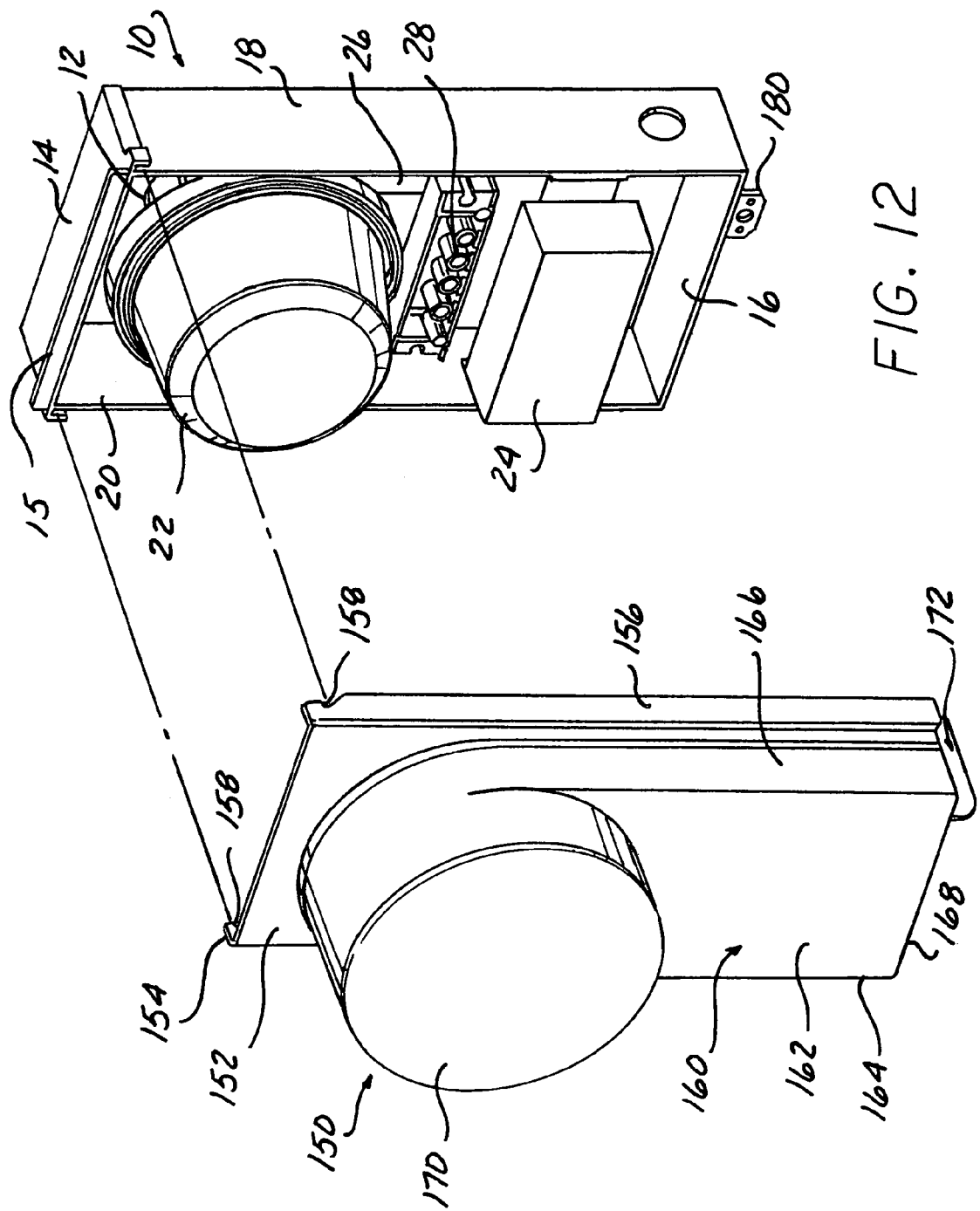
FIG. 12 is an exploded, perspective view of another aspect of an overall watthour meter enclosure safety replacement window and cover according to the present invention.

The present invention is a safety replacement window and/or cover for an overall watthour meter enclosure which addresses numerous deficiencies encountered with the long term use of prior art overall watthour meter enclosures which employed a glass window mounted in an aperture in a metal enclosure cover. As shown in FIG. 12, a back plate 10 is mountable in a electrical power service location, such as on a wall or other suitable surface. The back plate 10 is in the form of a receptacle having a back wall 12, a top wall 14, a bottom wall 16, and opposed side walls 18 and 20 arranged in a generally polygonal shape. A conventional bottom connected watthour meter 22 is fixedly mounted on the back wall 12 by means of mounting fasteners. A terminal block pictorially represented by reference number 24 in FIG. 12 is also mounted on the back wall 12 generally on a standoff extending between the sidewalls 18 and 20. The terminal block 24 provides readily accessible connections to electric power line conductors from the utility power service and load distribution conductors extending to the building site, both of which are not depicted in FIG. 12. Additional conductors between the watthour meter 22 and the terminal block 24 are not shown.

An optional bottom connected watthour meter socket adapter 26 is illustrated in FIG. 12 as being mounted on back wall 12 of the back plate 10. Such a socket adapter 26, as is well known, base plurality of plug in jaw contacts which receive the blade terminals of a modern plug in watthour meter 22. Electrical conductors are carried within the socket adapter 26 to terminal connections 28 at the bottom of the socket adapter 26. Additional conductors, not shown, are interconnected between the terminals 28 and the terminals in the terminal block 24.

Figure 1:
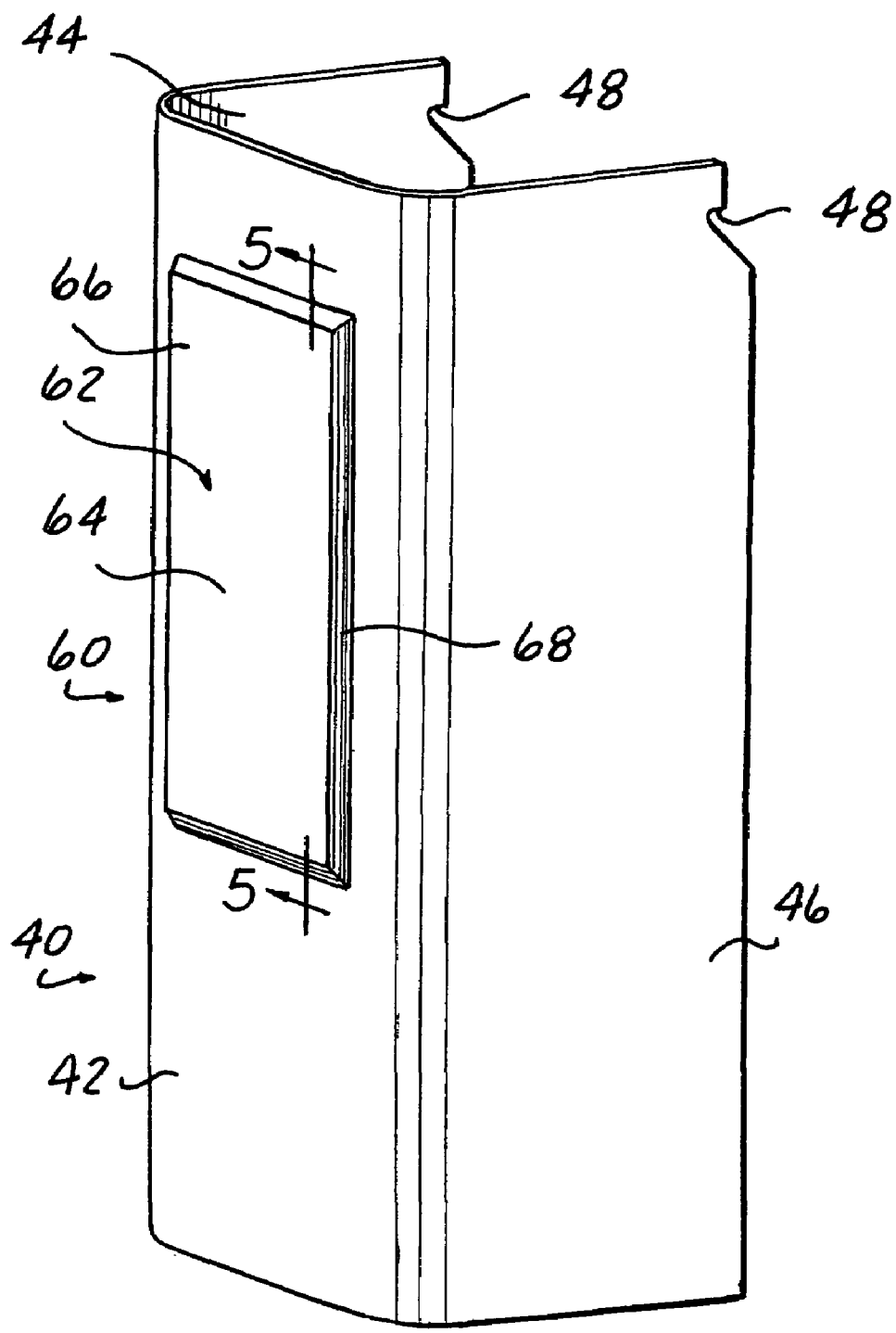
FIG. 1 is a perspective view of an overall watthour meter enclosure safety replacement window according to one aspect of the present invention depicted as mounted in an enclosure cover.

A cover 40 is typically pivotally or hingedly mounted on the back plate 10. As shown in FIG. 1, a typical overall watthour meter enclosure cover 40 is a one-piece structure formed of a front wall 42 and opposed sidewalls 44 and 46. A hinged connection in the form of a notch 48 is formed at an upper end of each sidewall 44 and 46 and is mountable over an upstanding flange 15 extending from one edge of the top wall 14 of the back plate 10 is shown in FIG. 12.

Figure 5:
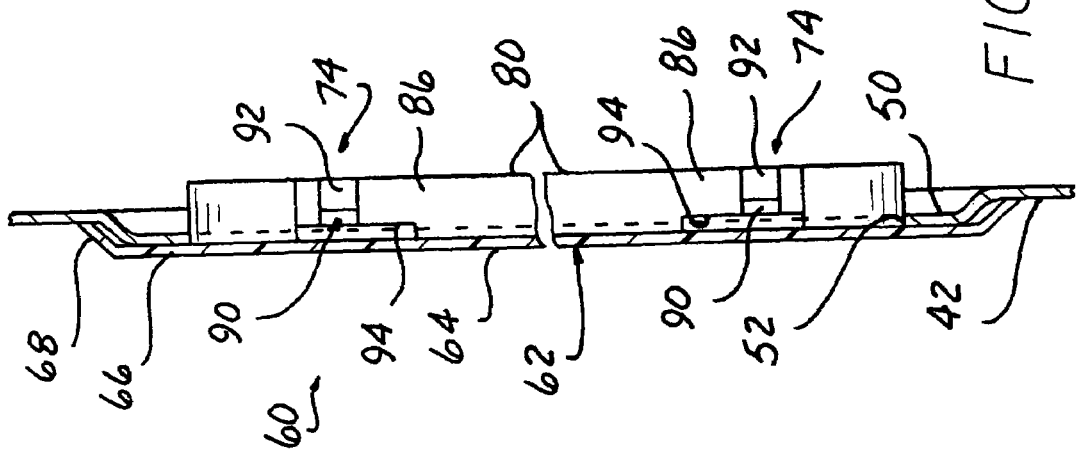
FIG. 5 is a cross-sectional view generally taken along line 5—5 in FIG. 1.
Figure 6:
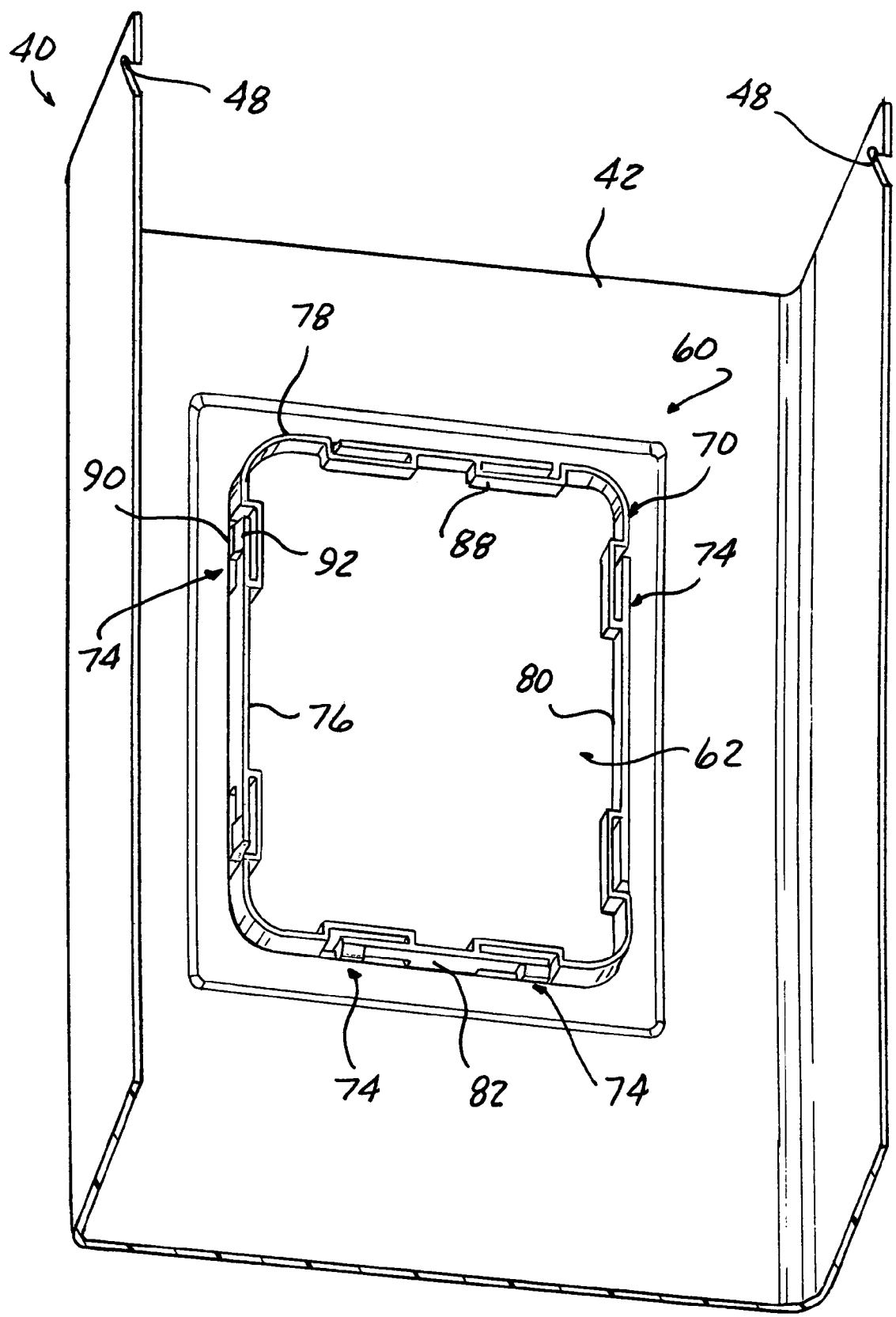
FIG. 6 is a rear perspective view showing the mounting of the replacement window of FIGS. 1–4 in an overall watthour meter enclosure cover.

As shown in FIG. 5, one type of cover 40 typically includes a raised boss 50 which extends out of the plane of the main portion of the front wall 42 of the cover 40. An aperture, typically polygonal in shape, is formed in the boss 50 and is covered by the glass window in a prior art overall watthour meter enclosure cover.

Referring now to FIGS. 1–6, there is depicted one aspect of a safety replacement window 60 for the cover 40. The safety replacement window 60 has a generally planar central wall 62 with a central portion 64 and a surrounding peripheral edge 66 which terminates in a tapered sidewall 68.

The safety replacement window 60 is typically formed as a one-piece member of a suitable molded plastic. For example, only, polycarbonate may be employed to form the replacement window 60. Preferably, the window 60 is formed of a transparent material in order to allow easy readability of the watthour meter power consumption dials located immediately behind the window 60 on the back plate 10.

By way of example only, the replacement window 60 is provided which different thickness portions. The center portion 64 of the central wall 62 is formed with a larger thickness than the thickness of the peripheral edge 66 and sidewall 68. This allows the sidewall 68 and the peripheral edge 66 to flex when the window 60 is mounted in the aperture 52.

Figure 2:
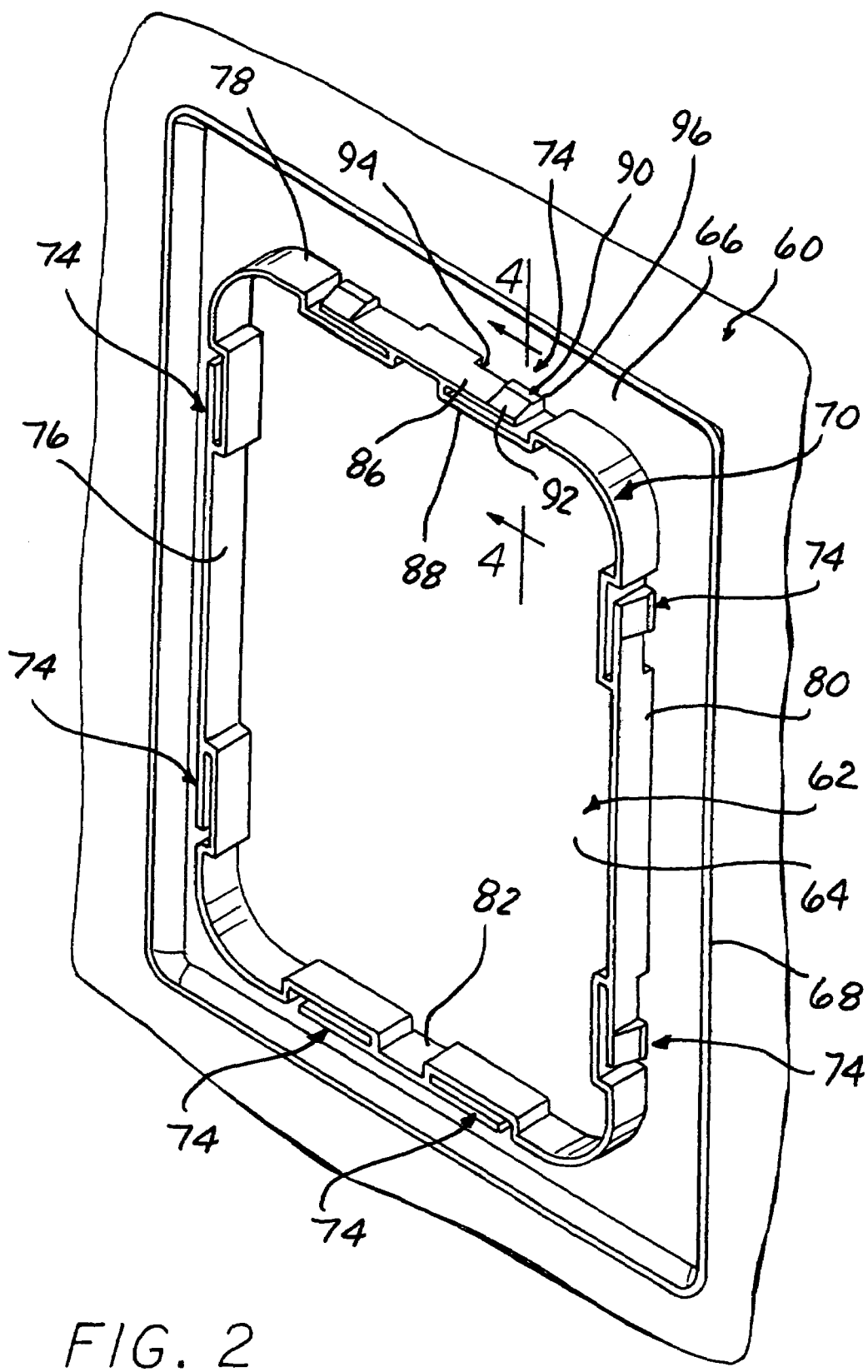
FIG. 2 is a rear perspective view of the replacement window shown in FIG. 1.

An inner barrier 70 is integrally formed with the central wall 62 and extends from a back surface of the central wall 62 as shown in FIG. 2. The barrier 70 functions as a water deflector as well as a centering mechanism for mounting the replacement window 60 in the window aperture 52.

The barrier 70 is typically in form of a single, continuous wall, although discontinuous portions may also be provided. The barrier 70 generally has a shape consistent with the inner edge on the raised boss 50 forming the aperture 52.

Mounting means in the form of at least one and preferably a plurality of clips denoted generally by reference number 74 are provided on the barrier 70. The clips 74 are provided along each side portion or wall of the barrier 70 with at least one clip 74 in each wall 76, 78, 80 and 82. For an even mounting force, two clips 74 are provided in each wall 76, 78, 80 and 82, by example only.

Each mounting clip 74 includes a resilient, cantilevered arm 86 which extends as a continuous co-planar extension of the adjacent wall, 76, 78, 80 and 82 of the barrier 70. Each arm 86 extends over a pocket formed by a notch 88 in each wall 76, 78, 80 and 82 of the barrier 70. The end of each arm 86 is formed as a wedge 90 having an inclined end surface 92. As shown in FIGS. 2 and 5, each arm 86 has a narrower width than the corresponding width of the adjacent portion of the barrier wall 76, 78, 80 or 82 to form a notch 94 between one edge of the arm 86 and the adjacent back surface of the wall 62 of the replacement window 60. The notch 94 is substantially equal to or slightly greater than the wall thickness of the raised boss 50 surrounding the window aperture 52 in the enclosure cover 40 to receive the boss 50 therein as shown in FIG. 5.

An additional and optional feature of the mounting clip 74, as shown in FIG. 2, is the provision of the two mounting clips in each barrier wall portion 76, 78, 80 and 82 having the arms 86 extending in opposite directions. This provides a more even mounting force to securely and evenly attach the replacement window 60 in the window aperture 52 of the enclosure cover 40.

In use, the replacement window 60 is aligned with the window aperture 52 and the barrier 70 is inserted through the inner edges of the raised boss 50 forming the window aperture 52. The replacement window 60 is forced into the aperture 52 causing the inclined end surfaces 92 on each wedge 90 to pivot the associated arm 86 inward into the adjacent pocket 88 until the upper edge of each wedge 90 clears the inner surface of the surrounding boss 50 at which time the mounting arm 86 snaps outward bringing the inner edge 96 of each wedge 90 underneath the adjacent surface of the boss 50 to securely attach the replacement window 60 to the raised boss 50 in the front wall 42 of the enclosure cover 40.

Any attempt to remove the replacement window 60 from the front wall 42 will cause the arms 86 to bend away from the back surface of the window 60. Due to the plastic material used to form the replacement window 60, such a bending movement will cause the arms 86 to tear or otherwise deform leaving visible crease marks in the arms 86 as an indication of attempted removal of the replacement window 60 from the enclosure cover 40.

Figure 7:
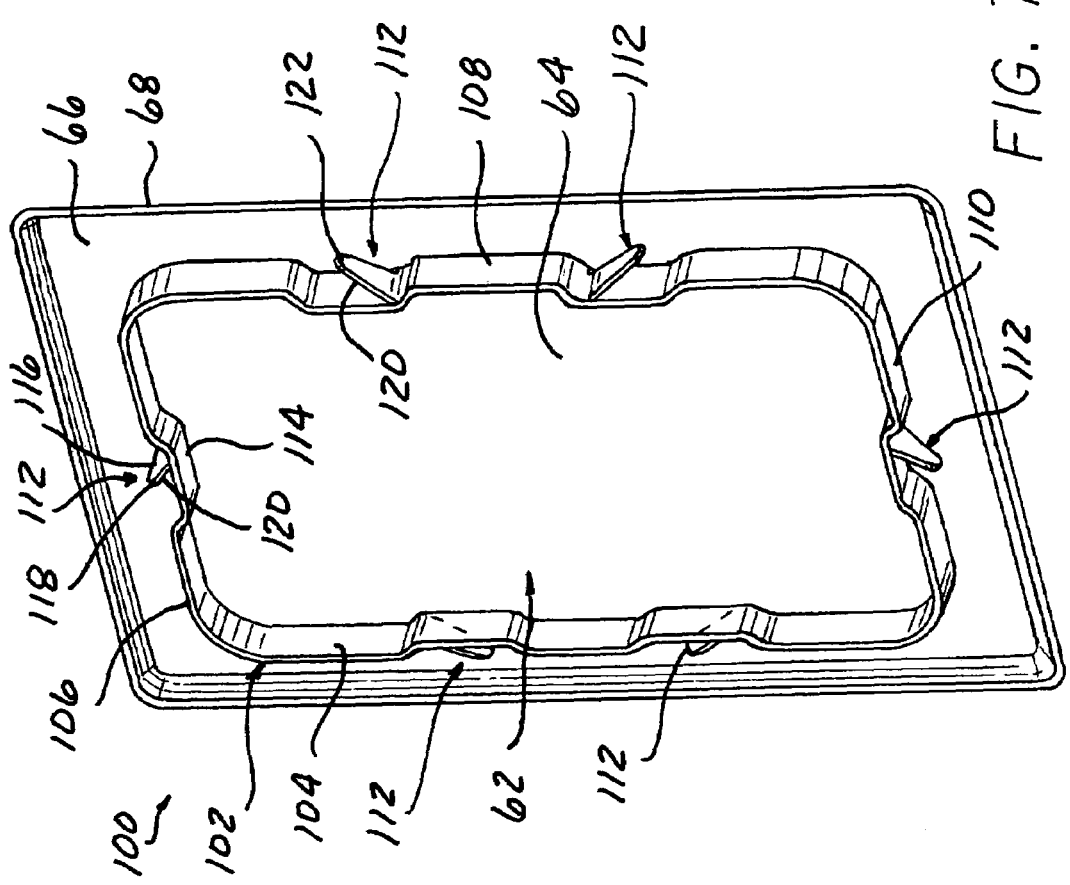
FIG. 7 is a rear perspective view of another aspect of a replacement window according to the present invention.
Figure 8:
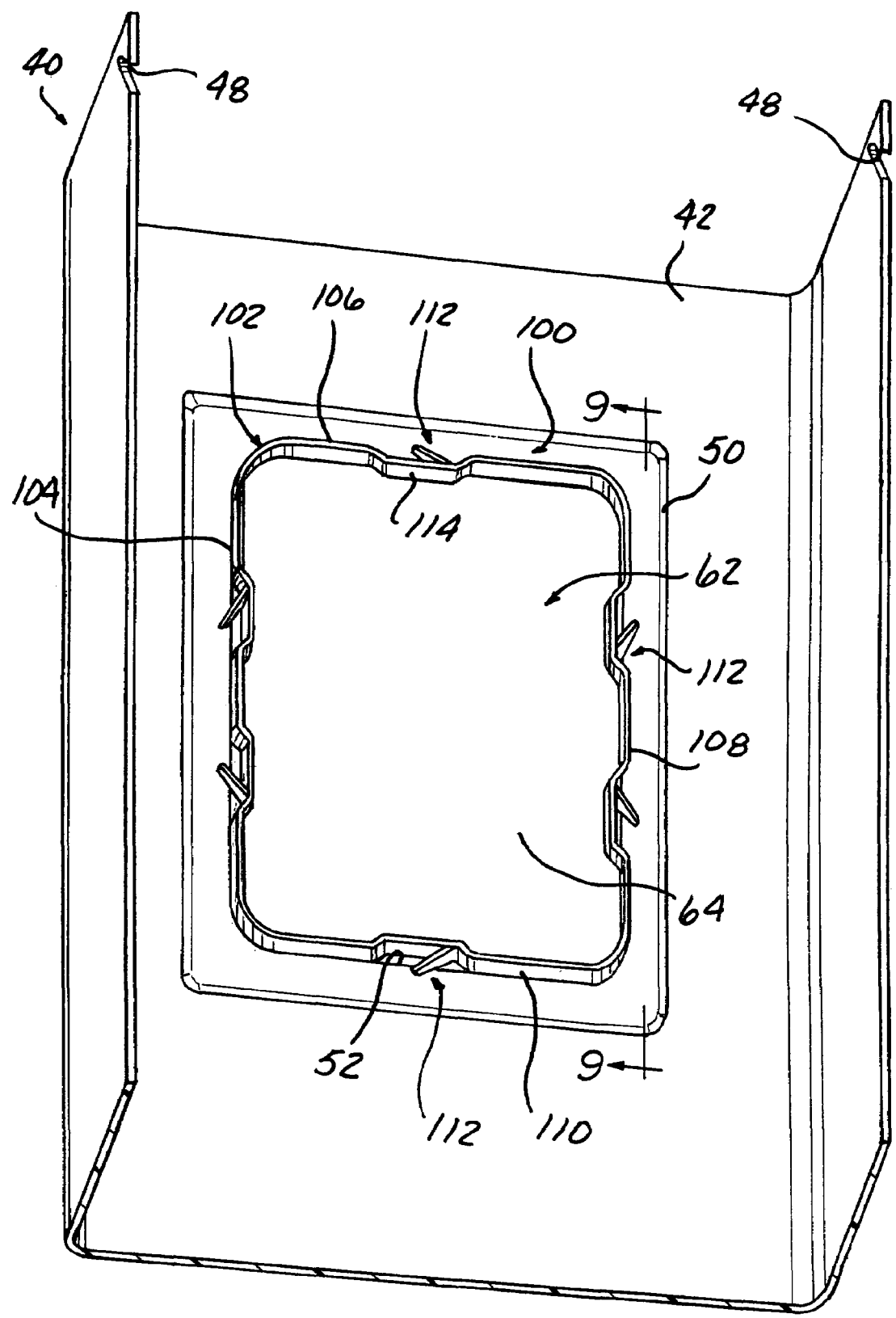
FIG. 8 is a rear perspective view showing the mounting of the replacement window of FIG. 7 in an overall watthour meter enclosure cover.
Figure 9:
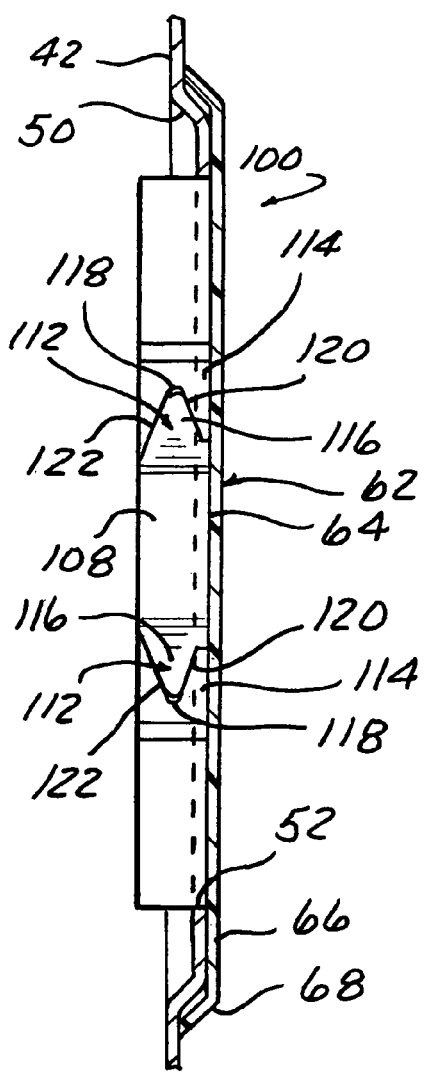
FIG. 9 is a cross-sectional view generally taken along line 9—9 in FIG. 8.

Referring now to FIGS. 7–9 there is depicted another aspect of a safety replacement window 100 according to the present invention. In this aspect, the replacement window 100 has an exterior wall 62 with a central portion 64, a peripheral portion 66 and a depending or tapered outer edge 68 which are identical to the corresponding elements of the replacement window 60 described above.

However, in this aspect of the invention, a barrier 102 is integrally formed or molded on the back surface of the wall 62 generally dividing the central portion 64 of the wall 62 from the peripheral portion 66 of the back surface. The barrier 102 includes interconnected walls 104, 106, 108 and 110 which are arranged by interconnected ends to form a polygon, such as the rectangular shape shown in FIGS. 7–9.

Mounting clips 112 are provided at a plurality of spaced locations in the walls 104, 106, 108 and 110. For example, two mounting clips are spaced apart along the longer length walls 104 and 108; while only one mounting clip 112 is formed in the shorter length walls 106 and 110. It will be understood that any number of mounting clips 112 may be mounted in the longer walls 104 and 108 such as two or more mounting clips 112 mounted in the shorter walls 106 and 110.

Each mounting clip 112 is identically constructed and includes a offset wall portion 114 in each wall 104, 106, 108 or 110 of the barrier 102. Generally, the offset wall portion 114 extends inward of the barrier 102 toward the central portion 64 of the wall 62. A flexible, resilient arm 116 is integrally molded on each offset wall portion 114 and projects outwardly from the offset wall portion 114 to an outer end 118. The outer end 118 of each arm 116 projects beyond the extent of the adjacent walls 104, 106, 108 and 110 of the barrier 102. One edge 120 of each arm 116 is tapered or angled with respect to the opposite edge 122. The tapered edge 120 provides a caming force which forcibly urges the replacement window 110 into secure engagement with the edges of the raised boss 52 surrounding the window aperture 50 when the replacement window 100 is forcibly inserted into the window aperture 52.

The insertion sequence is shown in greater detail in FIG. 9. During the installation of the replacement window 100 in the window aperture 52 in the front wall 42 of the cover 40, the inclined edge 120 of each arm 116 will initially contact the edge of the raised boss 50 surrounding the window aperture 52 and be forced outward away from the adjacent wall 108 of the barrier 102. Each arm 116 will remain in forced engagement with the edge of the raised boss 50 to securely retain the replacement window 100 in the aperture 52 in the front wall 42 of the cover 40.

As in the previous aspect of the replacement window 60, the mounting clips 112 on the replacement window 100 show in FIGS. 7–9 are arranged in oppositely extending pairs along certain of the walls 104, 106, 108 and 110 of the barrier 102. As shown in FIG. 9, the arms 116 of the pair of mounting clips 112 on the wall 108 extend in opposite directions from each other.

Figure 11:
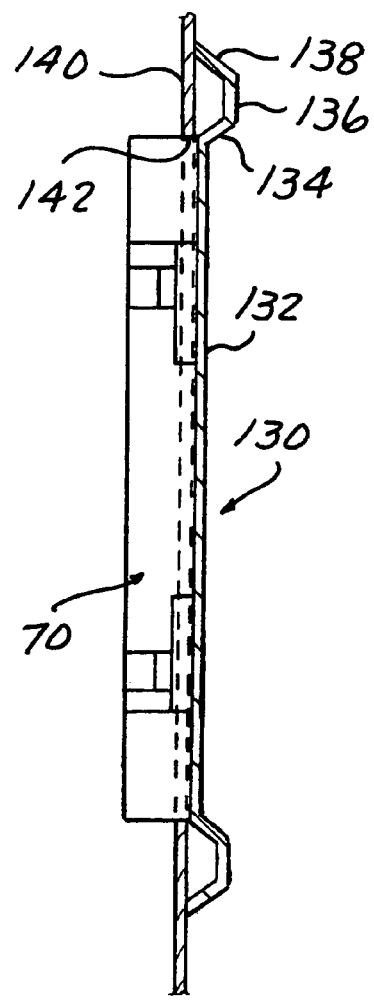
FIG. 11 is a cross-sectional view generally taken along line 11—11 in FIG. 10.
Figure 10:
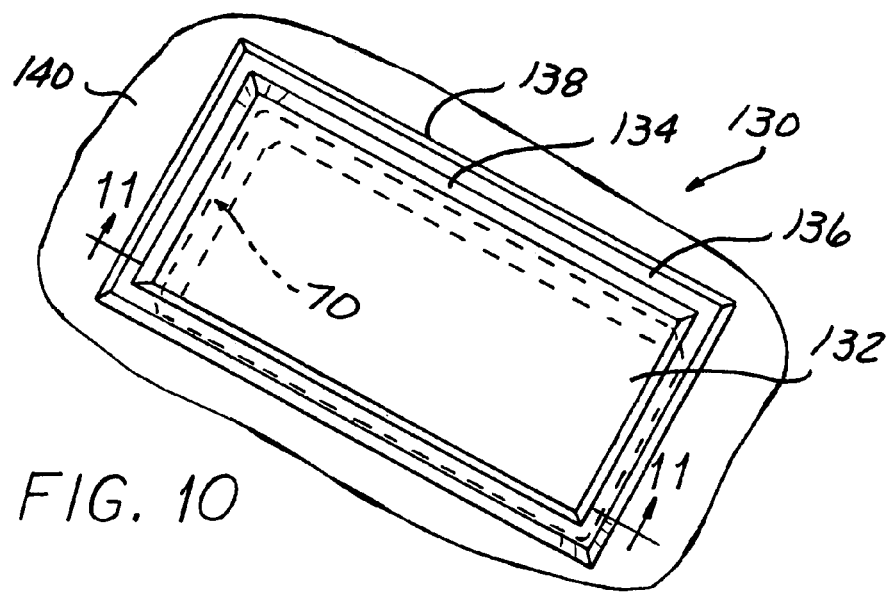
FIG. 10 is a perspective view of another aspect of a replacement window for an overall watthour meter enclosure according to the present invention.

In another aspect of a replacement window 130 shown in FIGS. 10 and 11, the replacement window 130 remains of a one-piece molded plastic construction with a central wall 132. An inclined peripheral edge 134 surrounds the central wall 132 and extends to a raised, planar wall 136 which is generally parallel to the central wall 132. An outer inclined edge 138 extends from the outer edge of the raised wall 136. Either of the barriers 70 or 102 may be formed or molded on the back surface of the window 130.

As shown in FIG. 11, the window 130 is advantageously employed with a front wall 140 of an overall watthour meter enclosure which does not have the raised boss 50. Rather, the entire front wall 140 has a generally planar wall with a window aperture 142 formed therein. The barrier 70 mounts the replacement window 130 in the window aperture 142 in the same manner as described above and shown in FIGS. 1–5. The raised wall 136 and the adjoining inclined edges 134 and 138 provide forced engagement of the replacement window 130 with the front wall 140 of the cover, when the mounting clips carried on the barrier 70 forcibly engage the edges of the front wall 140 surrounding the window aperture 142.

Another aspect of a replacement window and cover 150 for an overall watthour meter enclosure is shown in FIGS. 12–16. In this aspect, the replacement window and cover 150 is formed of a one-piece, transparent, molded plastic which can be hingedly attached to the back plate 10 as described above for the cover 40 shown in FIG. 1. The replacement window and cover 150 includes a planar wall 152 and two sidewalls 154 and 156 projecting therefrom. Notches 158 are formed at one end of each of the side walls 154 and 156 for hinged attachment to the flange 15 on the back plate 10.

A watthour meter receiving pocket or receptacle 160 projects outwardly from the front wall 152. The receptacle 160 includes a generally rectangular end portion formed of a front wall 162 and opposed side walls 164 and 166. A bottom wall 168 closes the bottom of the receptacle 160. A generally annular portion 170 is formed at one end of the wall 162 for surrounding the end portion of the watthour meter 22 mounted in the back plate 10. At least the annular portion 170 is transparent; although it is economically advantageous to form the entire cover 150 of a transparent plastic.

Figure 13:
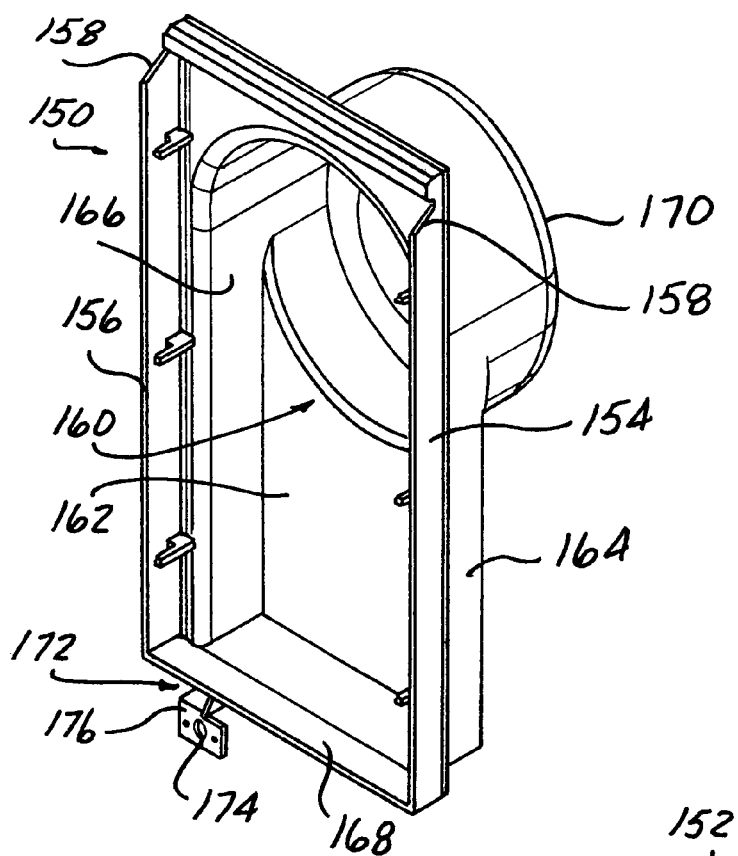
FIG. 13 is a rear perspective view of the replacement window and cover shown in FIG. 12.
Figure 15:
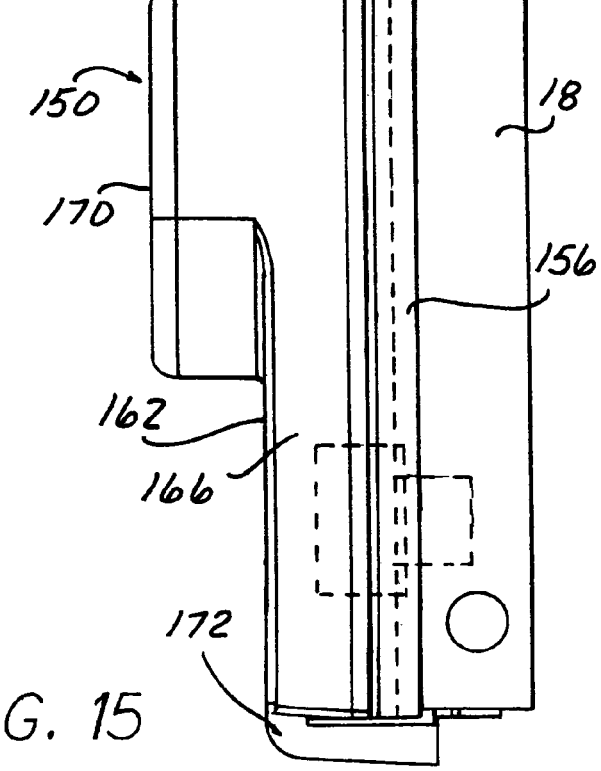
FIG. 15 is a side elevational view of the replacement window and cover of FIGS. 10–14 depicted in a fully mounted position on the back plate.
Figure 14:
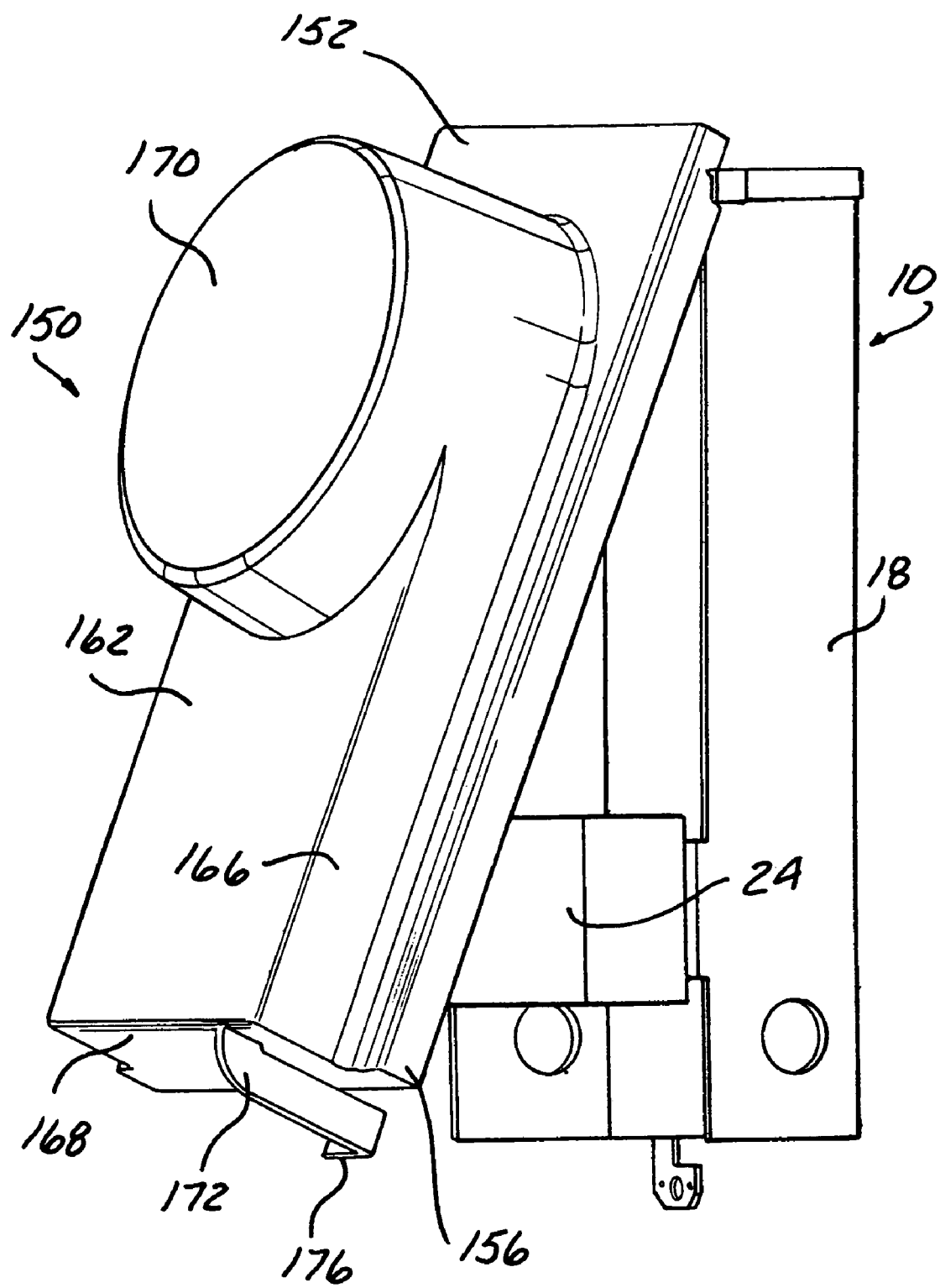
FIG. 14 is a perspective view showing the hinged attachment of the replacement window and cover of FIGS. 12 and 13 on a back plate.

As shown in FIGS. 13 and 14, an arm 172 is integrally formed with and extends below the bottom wall 168. The arm 172 has a two part, angled configuration with an aperture 174 formed in one leg 176.

Figure 16:
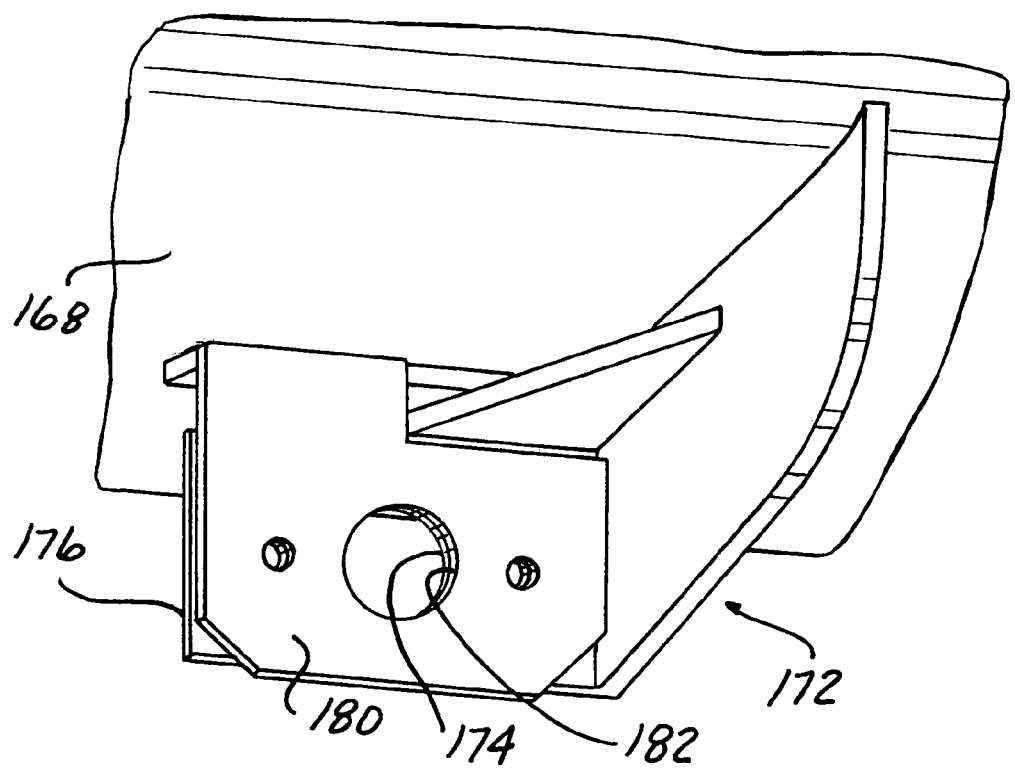
FIG. 16 is an enlarged, bottom, perspective view showing the of the lock members on the back plate and the replacement window and cover shown in FIGS. 12–15.

In use, the cover 150 is hingedly attached to the back plate 10 by engagement of the notches 158 on the cover 150 with the flange 15 on the back plate 10 as shown in FIG. 14. As the cover 150 is pivoted about the hinge notches 158 and the flange 15 toward the back plate 10, the lock arm 172 is forcibly urged behind a depending lock flange 180 formed on the bottom wall 16 of the back plate 10 as shown in FIGS. 12 and 16. This aligns the aperture 182 is the lock flange 180 with the aperture 174 in the lock arm 172. The aligned apertures 174 and 182 are capable of receiving a conventional padlock, or a wire or lead seal not shown to provide security for the closed watthour meter enclosure as well as to provide evidence of any unauthorized tampering with the enclosure.

Figure 17:
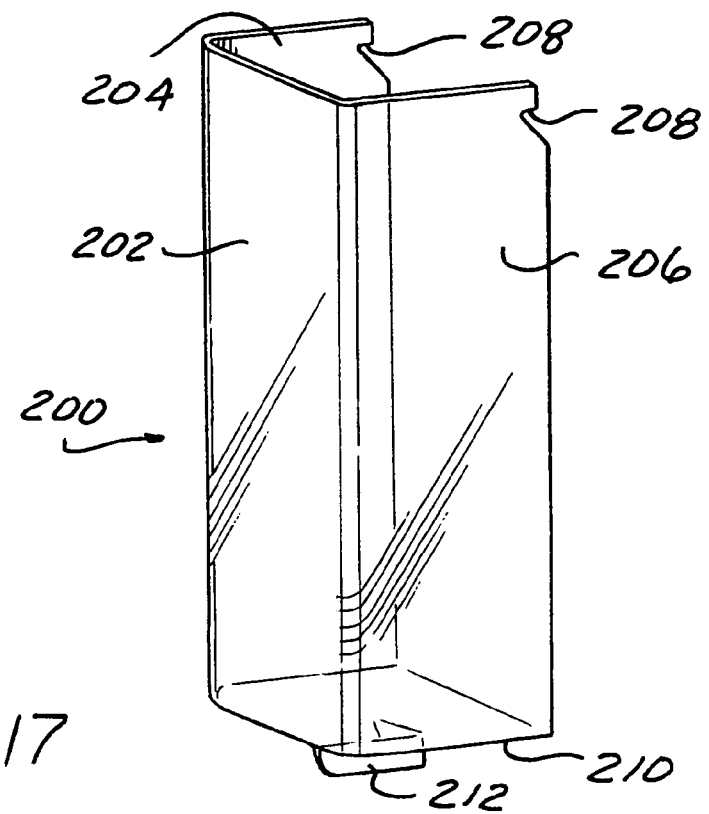
FIG. 17 is a perspective view of another aspect of a replacement window and cover according to the present invention.

Finally, referring to FIG. 17, there is depicted yet another aspect of a replacement window and cover 200 according to the present invention. In this aspect, the entire cover 200 is formed of a transparent plastic. The cover 200 has substantially the same shape as the cover 40 shown in FIG. 1 and includes a planar front wall 202 and opposed side walls 204 and 206, each having a hinge notch 208 formed at one end. A closed bottom wall 210 carries a lock arm 212, similar to the lock arm 172 described above.

The replacement cover 200 functions in the same manner as the cover 40 in that it completely surrounds and is lockably sealable to the back plate 10 to encompass a watthour meter mounted on the back plate 10. However, since the cover 200 is made of a transparent plastic, all of the watthour meter power indicator dials or gages are easily visible through the front wall 202.

In summary, there has been disclosed a unique replacement window and/or cover for an overall watthour meter enclosure which addresses deficiencies found in prior art overall watthour meter enclosures having glass windows mounted in a metal cover.

The replacement window is formed of a one-piece moldable plastic which is snapped into engagement with the cover through the window aperture. The replacement window is difficult to remove without visible evidence of such removal. At the same time, the replacement window provides easy view ability of the watthour meter power indicator dials.

The replacement window and/or cover also provides easy readability of the watthour meter power indicator dial, while at the same time providing the desired functions of a sealed enclosure surrounding a watthour meter, and lockable attachment to the enclosure backplate.

What is claimed is:

1. A safety replacement window for an overall watthour meter enclosure having a cover wit an aperture for viewing an internally mounted watthour meter, the replacement window comprising:

a transparent window adapted to be mounted in the aperture in a watthour meter enclosure cover; and mounting means, integrally formed on the window, for mounting the window in a the enclosure cover aperture.

2. The replacement window of claim 1 wherein:

the mounting means is adapted to releaseably mount the window in the enclosure cover aperture.

3. The replacement window of claim 1 wherein the mounting means comprises:

at least one mounting clip carried on the window.

4. A safety replacement window for an overall watthour meter enclosure having a cover with an aperture for viewing an internally mounted watthour meter, the replacement window comprising:

a transparent window adapted to be mounted in the aperture in a watthour meter enclosure cover;

mounting means, integrally formed on the window, for mounting the window in a the enclosure cover aperture; and a barrier depending from one surface of the window and adapted to be extendable through the aperture in the cover when the window is mounted on the cover.

5. The replacement window of claim 4 wherein:

the barrier defines a wall.

6. The replacement window of claim 5 wherein:

the window has a peripheral edge extending beyond a peripheral extent of the barrier.

7. The replacement window of claim 5 wherein the mounting means further comprises:

a plurality of mounting clips spacedly carried on the wall.

8. The replacement window of claim 5 wherein:

the mounting means comprises at least one mounting clip carried on the barrier.

9. The replacement window of claim 8 wherein:

the at least one mounting clip projects outwardly from the barrier toward the periphery of the window.

10. The replacement window of claim 9 wherein the mounting clip comprises:

an arm pivotally carried on the barrier, the arm having a ramp edge adapted to be engageable with the cover during insertion of the window into the cover to lockingly engage the window with the cover.

11. The replacement window of claim 10 further comprising:

the ramp edge of the arm spaced from the window to define a slot adapted to receive an edge of the cover therein.

12. The replacement window of claim 10 further comprising:

wherein the at least one mounting clip comprises a plurality of mounting clips mounted in spaced pairs along each of a plurality of walls of the barrier.

13. The replacement window of claim 12 wherein the arm of each mounting clip extends oppositely from the arm in the mounting clip in the associated pair of mounting clips.

14. The replacement window of claim 8 wherein the at least one mounting clip further comprises:

an arm pivotally carried on the barrier, the arm having an inclined edge engageable with an edge of the cover surrounding the window aperture.

15. The replacement window of claim 14 wherein the at least one mounting clip comprises:

a pair of mounting clips carried on at least one wall of the barrier, each mounting clip including an arm.

16. The replacement window of claim 15 wherein:
the arms of each pair of mounting clips extend oppositely from each other on the at least one wall of the barrier.

17. The replacement window of claim 6 further comprising:
the peripheral edge of the window extending above a central portion of the window.

18. The replacement window of claim 6 further comprising:
a central portion of the window having a first thickness within a peripheral extent of the barrier;
the peripheral edge of the window having a second, thinner thickness than the central portion of the window.

19. In an overall watthour meter enclosure including a watthour meter a plate adapted to carry a watthour meter, a cover mountable on the plate, an aperture formed in the cover, a window mountable on the cover in the aperture, and the enclosure an improvement comprising:
mounting means, integrally carried on the window, for fixedly mounting the window in the aperture in the cover.

20. The improvement of claim 19 wherein:
the mounting means releaseably mounts the window to the enclosure cover.

21. The improvement of claim 19 wherein the mounting means comprises:
at least one mounting clip carrier on the window.

22. In an overall watthour meter enclosure including a watthour meter a plate adapted to carry a watthour meter, a cover mountable on the plate, an aperture formed in the cover, a window mountable on the cover in the aperture, and the enclosure an improvement comprising:
mounting means, carried on the window, for fixedly mounting the window in the aperture in the cover; and
a barrier depending from one surface of the window and extendable through the aperture in the cover when the window is mounted on the cover.

23. The improvement of claim 22 wherein:
the barrier defines a wall.

24. The improvement of claim 23 wherein:
the window has a peripheral edge extending beyond a peripheral extent of the barrier.

25. The improvement of claim 23 wherein the mounting means comprises:
a plurality of mounting clips spacedly carried on the wall.

26. The improvement of claim 23 wherein:
the mounting means comprises at least one mounting clip carried on the barrier.

27. The improvement of claim 26 wherein:
the at least one mounting clip projects outwardly from the barrier toward the periphery of the window.

28. The improvement of claim 27 wherein the mounting clip comprises:
an arm pivotally carried on the barrier, the arm having a ramp edge engageable with the cover during insertion of the window into the cover to lockingly engage the window with the cover.

29. The improvement of claim 28 further comprising:
the ramp edge of the arm spaced from window to define a slot receiving an edge of the cover therein.

30. The improvement of claim 28 further comprising:
wherein the at least one mounting clip comprises a plurality of mounting clips mounted in spaced pairs along each of a plurality of walls of the barrier.

31. The improvement of claim 30 wherein the arm of each mounting clip extends oppositely from the arm in the mounting clip in the associated pair of mounting clips.

32. The improvement of claim 26 wherein the mounting means further comprises:
an arm pivotally carried on the barrier, the arm having an inclined edge engageable with an edge of the cover surrounding the window aperture.

33. The improvement of claim 32 wherein the at least one mounting clip comprises:
a pair of mounting clips carried on at least one wall of the barrier, each mounting clip including an arm.

34. The improvement of claim 33 wherein:
the arms of each pair of mounting clips extend oppositely from each other on the at least one wall of the barrier.

35. The improvement of claim 24 further comprising: the peripheral edge of the window extending above a central portion of the window.

36. The improvement of claim 24 further comprising:
a central portion of the window having a first thickness within a peripheral extent of the barrier;
the peripheral edge portion of the window having a second, thinner thickness than the central portion of the window.

37. In an overall watthour meter enclosure for a watthour meter, the improvement comprising:
a plate adapted to carry a watthour meter; and
a one piece cover removably mounted on the plate and adapted for encompassing all portions of a watthour meter mounted on the plate, the cover having at least a transparent portion positioned for viewing the watthour meter through the cover.

38. The improvement of claim 37 further comprising:
the cover having a front wall; and
a pocket formed in the front wall far surrounding an end portion of a watthour meter mounted on the plate.

39. The improvement of claim 37 wherein the cover further comprises:
a bottom wall;
a lock arm carried on the bottom wall and adapted to register with a lock member carried on the plate; and
apertures in the lock arm and the lock member adapted for receiving a lock means for securing the cover to the plate.

40. The improvement of claim 37 wherein the cover further comprises:
a planar front wall and opposed sidewalls extending from the front wall.

* * * * *

UNITED STATES PATENT AND TRADEMARK OFFICE
CERTIFICATE OF CORRECTION

PATENT NO. : 6,975,504 B2  Page 1 of 1
DATED : December 13, 2005
INVENTOR(S) : Darrell Robinson and Allen V. Pruchs It is certified that error appears in the above-identified patent and that said Letters Patent is hereby corrected as shown below:

<u>Title page, Item [54] and Column 1, line 1,</u>
Title, should read as follows:
-- OVERALL WATTHOUR METER ENCLOSURE SAFETY REPLACEMENT WINDOW --.

Signed and Sealed this

Fourth Day of April, 2006

JON W. DUDAS
*Director of the United States Patent and Trademark Office*